United States Patent
Yang et al.

(10) Patent No.: US 9,344,002 B2
(45) Date of Patent: May 17, 2016

(54) ADAPTIVE SAMPLING CIRCUIT FOR DETECTING THE DEMAGNETIZED VOLTAGE OF THE TRANSFORMER

(71) Applicant: SYSTEM GENERAL CORP., Taipei Hsien (TW)

(72) Inventors: Ta-Yung Yang, Milpitas, CA (US); Li Lin, Taipei (TW); Jung-Sheng Chen, Kaohsiung County (TW); Chih-Hsien Hsieh, Changhua County (TW)

(73) Assignee: System General Corp., Taipei Hsien (TW)

( * ) Notice: Subject to any disclaimer, the term of this patent is extended or adjusted under 35 U.S.C. 154(b) by 526 days.

(21) Appl. No.: 13/742,529

(22) Filed: Jan. 16, 2013

(65) Prior Publication Data

US 2013/0182476 A1    Jul. 18, 2013

Related U.S. Application Data

(60) Provisional application No. 61/587,189, filed on Jan. 17, 2012.

(51) Int. Cl.
*H02M 7/48* (2007.01)
*H02M 3/335* (2006.01)
*G01R 31/42* (2006.01)

(52) U.S. Cl.
CPC ............ *H02M 7/48* (2013.01); *H02M 3/33523* (2013.01); *G01R 31/42* (2013.01)

(58) Field of Classification Search
CPC ..... H02M 7/48; H02M 3/33523; G01R 31/42

USPC ....................... 363/95, 87, 131; 323/247, 355
See application file for complete search history.

(56) References Cited

U.S. PATENT DOCUMENTS

| | | | | |
|---|---|---|---|---|
| 3,460,133 | A * | 8/1969 | Ulrich | 341/171 |
| 7,016,204 | B2 * | 3/2006 | Yang et al. | 363/21.13 |
| 7,151,681 | B2 * | 12/2006 | Yang et al. | 363/21.13 |
| 7,349,229 | B1 * | 3/2008 | Yang | 363/21.16 |
| 7,486,528 | B2 * | 2/2009 | Yang | 363/21.12 |
| 7,671,578 | B2 * | 3/2010 | Li et al. | 324/72 |
| 8,094,468 | B2 * | 1/2012 | Yang et al. | 363/21.18 |
| 8,164,928 | B2 * | 4/2012 | Lin et al. | 363/21.16 |
| 8,542,507 | B2 * | 9/2013 | Hsu et al. | 363/53 |
| 2007/0081599 | A1 * | 4/2007 | Yang | 375/258 |
| 2011/0182088 | A1 * | 7/2011 | Lidak et al. | 363/21.12 |

* cited by examiner

*Primary Examiner* — Jessica Han
(74) *Attorney, Agent, or Firm* — Rosenberg, Klein & Lee (57) ABSTRACT

An adaptive sampling circuit of the power converter according to the present invention comprises a sample-and-hold unit and a signal-generation circuit. The sample-and-hold unit is coupled to a transformer to generate a feedback signal by sampling a demagnetized voltage of the transformer in response to a sample signal. The signal-generation circuit generates the sample signal in response to a magnetized voltage of the transformer, the demagnetized voltage of the transformer, a switching signal and a code. The sample signal is used for sampling the demagnetized voltage. The feedback signal is correlated to an output voltage of the power converter. The switching signal is generated in response to the feedback signal for switching the transformer and regulating the output of the power converter. The adaptive sampling circuit is used to precisely measure the demagnetized voltage of the transformer without the limitation of the transformer design.

12 Claims, 6 Drawing Sheets

ADAPTIVE SAMPLING CIRCUIT FOR DETECTING THE DEMAGNETIZED VOLTAGE OF THE TRANSFORMER

REFERENCE TO RELATED APPLICATION

This Application is based on Provisional Patent Application Ser. No. 61/587,189, filed 17 Jan. 2012, currently pending.

BACKGROUND OF THE INVENTION

1. Field of the Invention

The present invention relates to a power converter, and more specifically relates to an adaptive sampling circuit of a control circuit of the power converter.

2. Description of the Related Art

The demagnetized voltage is utilized to generate a feedback signal for the power converter. Many prior arts had been disclosed for the detection of the demagnetized voltage of the transformer, such as "Multiple-sampling circuit for measuring reflected voltage and discharge time of a transformer" U.S. Pat. No. 7,151,681; "Causal sampling circuit for measuring reflected voltage and demagnetizing time of transformer" U.S. Pat. No. 7,349,229; and "Linear-predict sampling for measuring demagnetized voltage of transformer" U.S. Pat. No. 7,486,528. However, the complexity is the drawback of the U.S. Pat. No. 7,151,681. The disadvantage of the U.S. Pat. No. 7,349,229 is the imprecise sampling in response to the dynamic loading or the input-voltage change. The approach of the U.S. Pat. No. 7,486,528 is limited by the turn ratio of the transformer design. The present invention provides an adaptive method using "linear-predict sampling" without the limitation of the transformer design.

BRIEF SUMMARY OF THE INVENTION

The object of the present invention is to provide an adaptive sampling circuit to precisely measure a demagnetized voltage of the transformer.

The adaptive sampling circuit of the power converter according to the present invention comprises a sample-and-hold unit and a signal-generation circuit. The sample-and-hold unit is coupled to a transformer to generate a feedback signal by sampling a demagnetized voltage of the transformer in response to a sample signal. The signal-generation circuit generates the sample signal in response to a magnetized voltage of the transformer, the demagnetized voltage of the transformer, a switching signal and a code. The sample signal is used for sampling the demagnetized voltage. The feedback signal is correlated to an output voltage of the power converter. The switching signal is generated in response to the feedback signal for switching the transformer and regulating the output of the power converter.

A control circuit according to the present invention comprises a PWM circuit and a counter circuit. The PWM circuit is coupled to generate a switching signal to control switching of a power switch to regulate an output of a power converter. The counter circuit generates a code in response to a demagnetized period of a switching cycle of the switching signal.

BRIEF DESCRIPTION OF THE DRAWINGS

The accompanying drawings are included to provide further understanding of the invention, and are incorporated into and constitute a part of this specification. The drawings illustrate embodiments of the invention and, together with the description, serve to explain the principles of the invention.

DETAILED DESCRIPTION OF EMBODIMENTS

Figure 1:
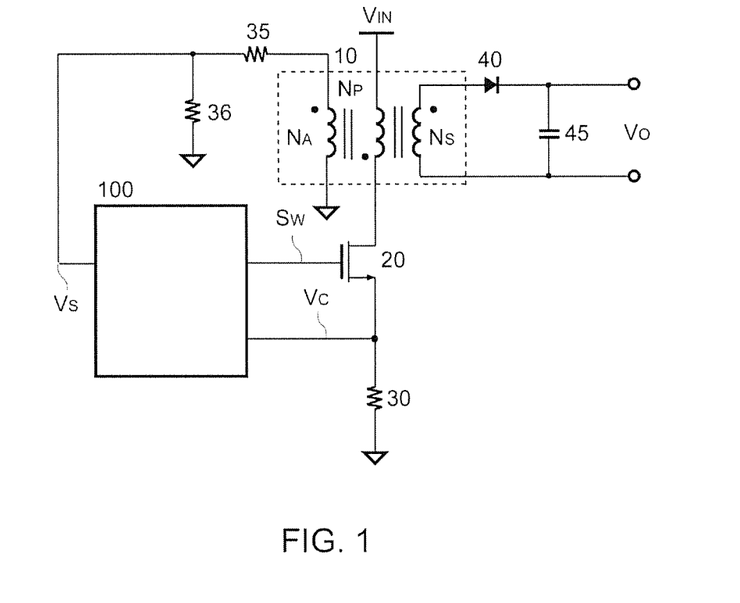
FIG. 1 shows a circuit diagram of an embodiment of a switching power converter in accordance with the present invention.

FIG. 1 shows a circuit diagram of an embodiment of a switching power converter in accordance with the present invention. The switching power converter comprises a transformer 10 having an auxiliary winding $N_A$, a primary winding $N_P$, and a secondary winding $N_S$. A terminal of the primary winding $N_P$ is coupled to an input voltage $V_{IN}$. The secondary winding $N_S$ generates an output voltage $V_O$ via a rectifier 40 and a capacitor 45. In order to regulate the output voltage $V_O$, a switching control circuit 100 generates a switching signal $S_W$ to switch the transformer 10 via a transistor 20. The transistor 20 serves as a power switch. The transistor 20 is coupled to the other terminal of the primary winding $N_P$ of the transformer 10. When the transistor 20 is turned on, a magnetized voltage (the input voltage $V_{IN}$) is applied to the transformer 10. A charge current is therefore flowed through the primary winding $N_P$ of the transformer 10 and the transistor 20.

Through a resistive device 30 coupled between the transistor 20 and the ground, the charge current is converted to a current signal $V_C$ coupled to the switching control circuit 100. The energy stored into the transformer 10 during the magnetized period is delivered to the secondary winding $N_S$ and auxiliary winding $N_A$ of the transformer 10 once the transistor 20 is turned off. If the forward voltage of the rectifier 40 can be neglected, a demagnetized voltage $V_{AUX}$ of the auxiliary winding $N_A$ can be expressed as, $$V_{AUX} = \frac{N_A}{N_S} \times V_O \quad (1)$$

where $N_A$ and $N_S$ are respectively the winding turns of the auxiliary winding and the secondary winding of the transformer 10. According to the equation (1), the demagnetized voltage $V_{AUX}$ represents the output voltage $V_O$ of the power converter.

A voltage divider formed by resistors 35 and 36 generate a signal $V_S$ in accordance with the demagnetized voltage $V_{AUX}$. It can be shown as, $$V_S = \frac{R_{36}}{R_{35} + R_{36}} \times V_{AUX} \quad (2)$$

where $R_{35}$ and $R_{36}$ are respectively the resistance of the resistors 35 and 36. The signal $V_S$ represents the demagnetized voltage $V_{AUX}$.

In order to precisely detect the output voltage $V_O$ of the power converter, the demagnetized voltage should be measured after the switching current of the secondary winding $N_S$ closes to the zero. Therefore, the variation of the forward voltage of the rectifier 40 can be neglected. The charge current is flowed through the transformer 10 when the magnetized voltage (the input voltage $V_{IN}$) is applied to the transformer 10. A discharge current is produced according to the demagnetized voltage (the output voltage $V_O$) across the secondary winding $N_S$ of the transformer 10 during the demagnetized time. The discharge current represents the switching current of the secondary winding $N_S$ of the transformer 10. It will reduce to zero at the end of the demagnetized time. Therefore, the demagnetized voltage of the transformer 10 should be sampled right before the end of demagnetized time. It indicates that the demagnetized voltage is sampled before the transformer 10 is fully demagnetized.

$$I_C = \frac{V_{IN}}{L_P} \times T_{CHARGE} \quad (3)$$

$$I_D = \frac{V_O}{L_S} \times T_{DISCHARGE} \quad (4)$$

where $I_C$ is the charge current; $I_D$ is the discharge current; $L_P$ and $L_S$ are inductances of the primary winding $N_P$ and secondary winding $N_S$ of the transformer 10, respectively. $T_{CHARGE}$ is the magnetized time; $T_{DISCHARGE}$ is the demagnetized time.

The magnetized flux $\Phi_C$ of the transformer 10 is equal to the demagnetized flux $\Phi_D$. The equality is shown as, $$\Phi_C = \Phi_D \quad (5)$$

$$\Phi = B \times Ae = \frac{V \times T}{N} \quad (6)$$

$$\frac{V_{IN}}{N_P} \times T_{CHARGE} = \frac{V_O}{N_S} \times T_{DISCHARGE} \quad (7)$$

$$V_{IN} \times T_{CHARGE} = \frac{N_P}{N_S} \times V_O \times T_{DISCHARGE} \quad (8)$$

where B is the flux density; Ae is the cross-section area of the transformer 10; T is the magnetized time or the demagnetized time of the transformer 10; N is the winding turns of the transformer 10.

The demagnetized time $T_{DISCHARGE}$ of the transformer 10 can be obtained in accordance with the equation (8).

$$T_{DISCHARGE} = \frac{N_S}{N_P} \times \frac{V_{IN}}{V_O} \times T_{CHARGE} \quad (9)$$

The equation (9) shows the demagnetized time $T_{DISCHARGE}$ can be predicted in accordance with the magnetized voltage $V_{IN}$, the demagnetized voltage $V_O$ and the magnetized time $T_{CHARGE}$. The magnetized time $T_{CHARGE}$ is corresponded to the enable time of the switching signal $S_W$. The $N_S/N_P$ is the turn ratio of the transformer 10.

Figure 2:
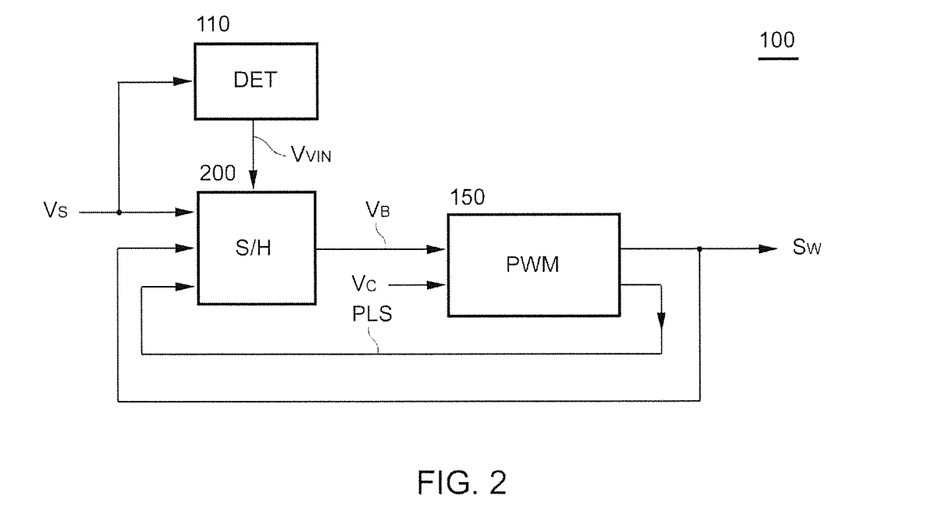
FIG. 2 is a circuit diagram of an embodiment of the switching control circuit in accordance with the present invention.

FIG. 2 is a circuit diagram of an embodiment of the switching control circuit 100 in accordance with the present invention. It includes a detection circuit (DET) 110, a pulse-width modulation circuit (PWM) 150, and a sample-and-hold circuit (S/H) 200. The detection circuit 110 generates a signal $V_{VIN}$ in accordance with the magnetized voltage (the input voltage) $V_{IN}$. Therefore, the signal $V_{VIN}$ is correlated the magnetized voltage. The detail skills of detecting the input voltage $V_{IN}$ of the transformer 10 and the power converter can be found in "Control method and circuit with indirect input voltage detection by switching current slope detection", U.S. Pat. No. 7,616,461; "Detection circuit for sensing the input voltage of transformer", U.S. Pat. No. 7,671,578.

The signal $V_{VIN}$ is coupled to the sample-and-hold circuit 200 for sampling the demagnetized voltage and generating a feedback signal $V_B$ in accordance with the signal $V_S$ and the switching signal $S_W$. The feedback signal $V_B$ is coupled to the PWM circuit 150 to generate the switching signal $S_W$ to control switching of the transistor 20 (as shown in FIG. 1) for regulating the output of the power converter. The PWM circuit 150 is further coupled to receive the current signal $V_C$ and generates a pulse signal PLS. The sample-and-hold circuit 200 is coupled to the PWM circuit 150 to receive the pulse signal PLS.

Figure 3:
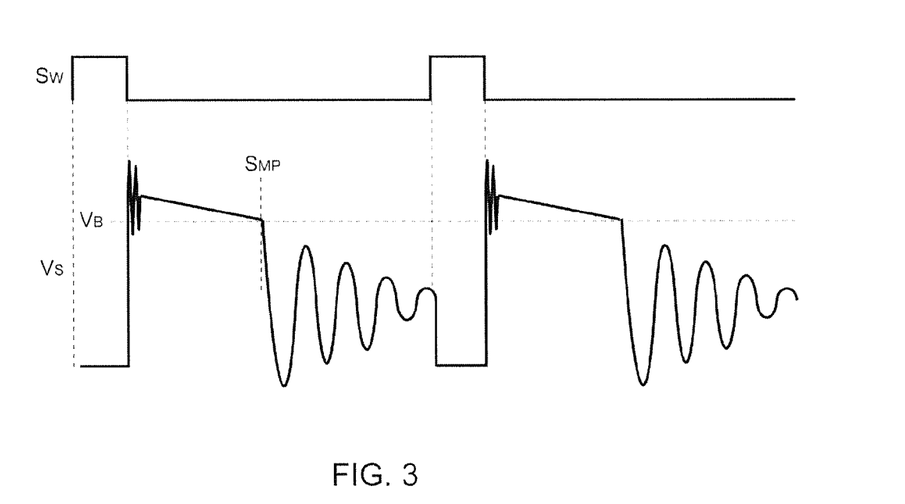
FIG. 3 shows the signal waveforms of the switching signal $S_W$, the signal $V_S$ and the feedback signal $V_B$ in accordance with the present invention.

FIG. 3 shows the signal waveforms of the switching signal $S_W$, the signal $V_S$ and the feedback signal $V_B$. The signal $V_S$ represented the demagnetized voltage is sampled by a sample signal $S_{MP}$ for generating the feedback signal $V_B$ before the end of the demagnetized time $T_{DISCHARGE}$ of the transformer 10 (as shown in FIG. 1).

Figure 4:
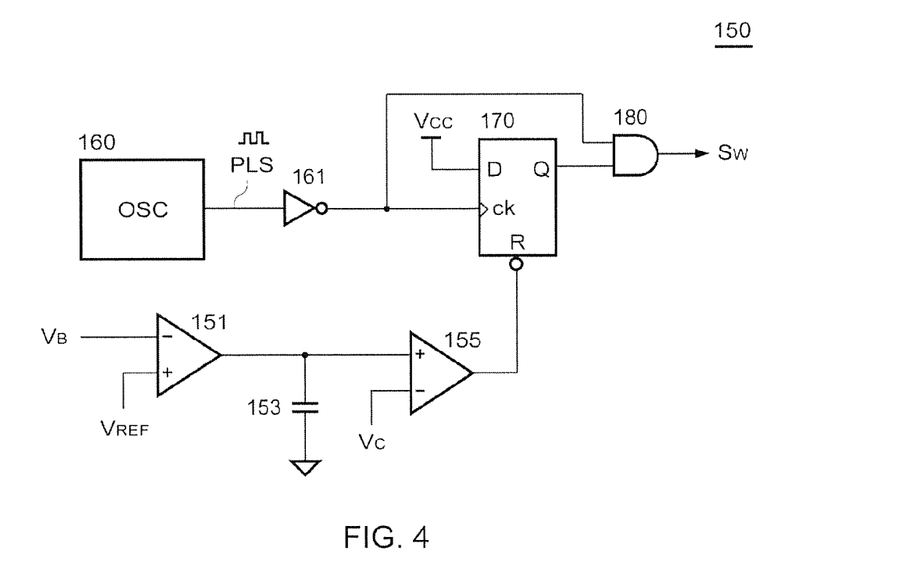
FIG. 4 shows a circuit diagram of an embodiment of the PWM circuit in accordance with the present invention.

FIG. 4 is a circuit diagram of an embodiment of the PWM circuit 150 in accordance with the present invention. The PWM circuit 150 comprises an error amplifier 151, a frequency compensation capacitor 153, a comparator 155, an oscillation circuit (OSC) 160, an inverter 161, a flip-flop 170, and an AND gate 180.

The feedback signal $V_B$ is coupled to a negative input terminal of the error amplifier 151. The error amplifier 151 includes a reference voltage $V_{REF}$ supplied with its positive input terminal. An output terminal of the error amplifier 151 is coupled to the frequency compensation capacitor 153. The oscillation circuit 160 generates the pulse signal PLS, and the pulse signal PLS is coupled to a clock input terminal ck of the flip-flop 170 through the inverter 161 to enable the flip-flop 170 periodically. An input terminal D of the flip-flop 170 is coupled to receive a supply voltage $V_{CC}$. An output terminal Q of the flip-flop 170 is connected to an input terminal of the AND gate 180 for generating the switching signal $S_W$. Another input terminal of the AND gate 180 is connected to the pulse signal PLS through the inverter 161.

The output terminal of the error amplifier 151 is connected to a positive input terminal of the comparator 155. A negative input terminal of the comparator 155 is coupled to receive the current signal $V_C$. The output of the comparator 155 is coupled to a reset input terminal R of the flip-flop 170 to reset the flip-flop 170. Therefore, the switching signal $S_W$ is generated in response to the feedback signal $V_B$.

Figure 5:
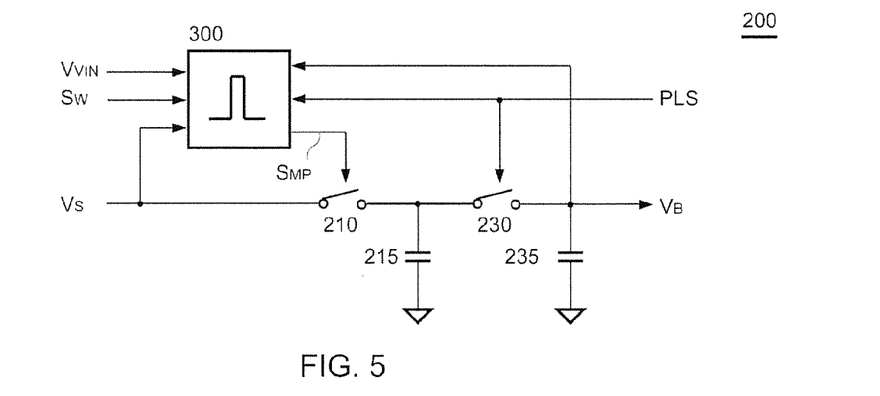
FIG. 5 is a circuit diagram of an embodiment of the sample-and-hold circuit in accordance with the present invention.

FIG. 5 is a circuit diagram of an embodiment of the sample-and-hold circuit 200 in accordance with the present invention. The adaptive sampling circuit comprises the sample-and-hold circuit 200 in accordance with the present invention. The sample-and-hold circuit 200 comprises a signal-generation circuit 300 that is utilized to generate the sample signal $S_{MP}$ in response to the switching signal $S_W$, the signal $V_{VIN}$, the feedback signal $V_B$, the signal $V_S$ and the pulse signal PLS. Therefore, the signal-generation circuit 300 generates the sample signal $S_{MP}$ in response to the magnetized voltage of the transformer 10 and the demagnetized voltage of the transformer 10.

A sample-and-hold unit comprises switches 210, 230 and capacitors 215, 235 to generate the feedback signal $V_B$ in accordance with the signal $V_S$. Therefore, the sample-and-hold unit generates the feedback signal $V_B$ in accordance with the demagnetized voltage of the transformer 10 (as shown FIG. 1) due to the signal $V_S$ represents the demagnetized voltage.

The first switch 210 is coupled between the signal $V_S$ of the transformer 10 and the first capacitor 215. The first switch 210 is controlled by the sample signal $S_{MP}$. The second switch 230 is controlled by the pulse signal PLS. The second capacitor 235 is utilized to generate the feedback signal $V_B$. The first switch 210 is coupled to the signal $V_S$ to sample the demagnetized voltage of the transformer 10 into the first capacitor 215 in response to the sample signal $S_{MP}$. The second switch 230 is coupled between the first capacitor 215 and the second capacitor 235 to sample the voltage of the first capacitor 215 to the second capacitor 235 in response to the pulse signal PLS.

The demagnetized voltage is corresponded to the output voltage $V_O$ (as shown FIG. 1) of the power converter. Therefore, the feedback signal $V_B$ is correlated to the output voltage $V_O$ of the power converter. The switching signal $S_W$ (as shown FIG. 2) is further generated in response to the feedback signal $V_B$ for switching the transformer 10 and regulating the output of the power converter.

Figure 6:
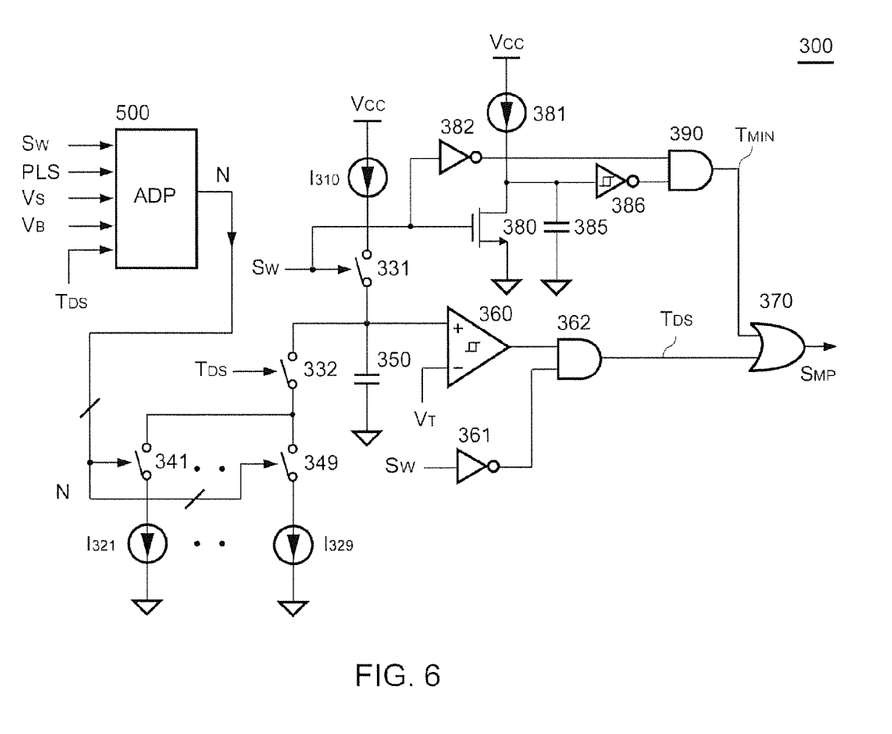
FIG. 6 is a circuit diagram of an embodiment of the signal-generation circuit in accordance with the present invention.

FIG. 6 is a circuit diagram of an embodiment of the signal-generation circuit 300 in accordance with the present invention. The signal-generation circuit 300 comprises a charge circuit and a discharge circuit. The charge circuit includes a current source $I_{310}$ and a switch 331. The current source $I_{310}$ is coupled to the supply voltage $V_{CC}$ to charge a capacitor 350 via the switch 331. The switch 331 is coupled between the current source $I_{310}$ and the capacitor 350, and is controlled by the switching signal $S_W$. The discharge circuit includes a plurality of current sources $I_{321} \ldots I_{329}$ and a plurality of switches 341 ... 349. A discharge current is developed by the current sources $I_{321} \ldots I_{329}$, in which the current sources $I_{321} \ldots I_{329}$ are enabled by the switches 341 ... 349, respectively. The discharge current is coupled to discharge the capacitor 350 via a switch 332.

The switch 332 is coupled between the discharge current and the capacitor 350, and is controlled by a demagnetized time signal $T_{DS}$. The on/off of the switches 341 ... 349 are controlled by a code N. The current source $I_{310}$ is correlated to the signal $V_{VIN}$ (the magnetized voltage ($V_{IN}$) of the transformer 10, as shown in FIG. 1 and FIG. 2). The current sources $I_{321} \ldots I_{329}$ are generated in accordance with the feedback signal $V_B$ (demagnetized voltage ($V_O$) of the transformer 10). Therefore, the current sources $I_{321} \ldots I_{329}$ are correlated to the feedback signal $V_B$ (demagnetized voltage). The code N is generated by an adaptive circuit (ADP) 500 in response to the switching signal $S_W$, the pulse signal PLS, the signal $V_S$, the feedback signal $V_B$, and the demagnetized time signal $T_{DS}$. The code N represents the turn ratio of the transformer 10 that is shown in the equation (9).

The capacitor 350 is further coupled to a positive input terminal of a comparator 360. A negative input terminal of the comparator 360 is coupled to a threshold $V_T$. The comparator 360 is utilized to compare a voltage of the capacitor 350 with the threshold $V_T$. When the switching signal $S_W$ is enabled, the capacitor 350 will be charged, and the voltage of the capacitor 350 will be higher than the threshold $V_T$. Once the switching signal $S_W$ is disabled, the capacitor 350 will be discharged until the voltage of the capacitor 350 is lower than the threshold $V_T$, and the comparator 360 will generate the demagnetized time signal $T_{DS}$ through an AND gate 362 and an inverter 361 for generating the sample signal $S_{MP}$. Therefore, the voltage of the capacitor 350 is utilized to generate the sample signal $S_{MP}$. The demagnetized time signal $T_{DS}$ represents the demagnetized time of the transformer 10.

The output of the comparator 360 is coupled to an input terminal of the AND gate 362. An input terminal of the inverter 361 is coupled to receive the switching signal $S_W$, and an output terminal of the inverter 361 is coupled to the other input terminal of the AND gate 362. An output terminal of the AND gate 362 generates the demagnetized time signal $T_{DS}$.

A current source 381, a capacitor 385, a transistor 380, inverters 382, 386 and an AND gate 390 develop a one-shot circuit and generate a minimum-period signal $T_{MIN}$ in response to the off state of the switching signal $S_W$. The minimum-period signal $T_{MIN}$ and the demagnetized time signal $T_{DS}$ are utilized to generate the sample signal $S_{MP}$ through an OR gate 370. The minimum-period signal $T_{MIN}$ is used to ensure that the sample signal $S_{MP}$ has a minimum pulse width in response to the off state of the switching signal $S_W$.

The switching signal $S_W$ is coupled to a gate of the transistor 380 to drive the transistor 380. One terminal of the current source 381 is coupled to the supply voltage $V_{CC}$. The other terminal of the current source 381 is coupled to a drain of the transistor 380, one terminal of the capacitor 385 and an input terminal of the inverter 386. A source terminal of the transistor 380 and the other terminal of the capacitor 385 are coupled to the ground. The capacitor 385 is charged by the current source 381 when the switching signal $S_W$ is disabled and the transistor 380 is turned off. An output terminal of the inverter 386 is coupled to one input terminal of the AND gate 390. The other input terminal of the AND gate 390 is coupled to receive the switching signal $S_W$ through the inverter 382. The pulse width of the minimum-period signal $T_{MIN}$ is determined by the current source 381 and the capacitance of the capacitor 385.

Figure 7A:
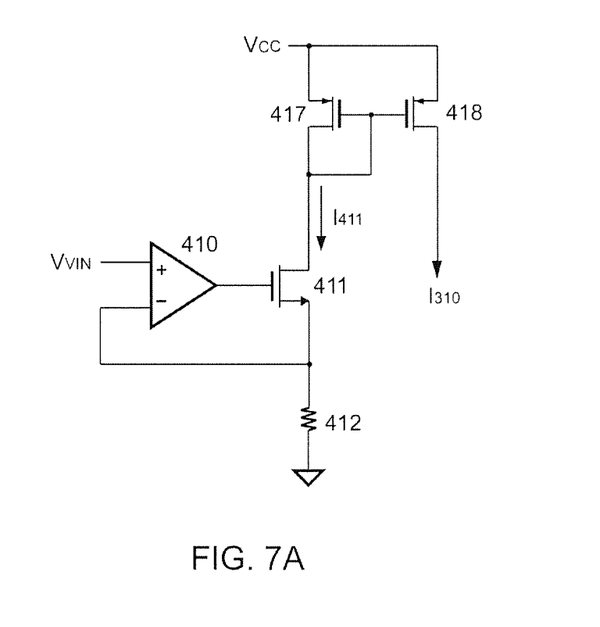
FIG. 7A shows a circuit diagram of an embodiment of a first V-I converter in accordance with the present invention.

FIG. 7A shows a circuit diagram of an embodiment of a first V-I converter in accordance with the present invention. The first V-I converter generates the current source $I_{310}$. An operational amplifier 410, a resistor 412 and transistors 411, 417, 418 form the first V-I converter. Through the first V-I converter, the current source $I_{310}$ is generated in accordance with the signal $V_{VIN}$. A positive input terminal of the operational amplifier 410 is coupled to receive the signal $V_{VIN}$. A negative input terminal of the operational amplifier 410 is coupled to a source of the transistor 411. A gate of the transistor 411 is coupled to an output terminal of the operational amplifier 410. A drain of the transistor 411 generates a current $I_{411}$. The resistor 412 is coupled between the negative input terminal of the operational amplifier 410 and the ground.

Gates of the transistor 417 and the transistor 418 are coupled each other and they all are coupled to drains of the transistor 417 and the transistor 411. Sources of the transistor 417 and the transistor 418 are coupled to the supply voltage $V_{CC}$. The current source $I_{310}$ is generated at a drain of the transistor 418.

Figure 7B:
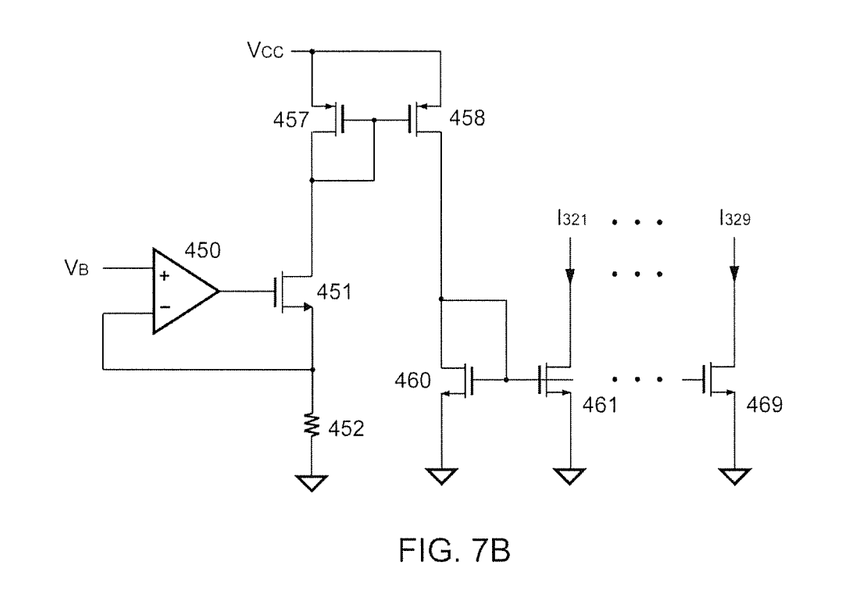
FIG. 7B shows a circuit diagram of an embodiment of a second V-I converter in accordance with the present invention.

FIG. 7B shows a circuit diagram of an embodiment of a second V-I converter in accordance with the present invention. The second V-I converter generates the current sources $I_{321} \ldots I_{329}$. An operational amplifier 450, a resistor 452 and transistors 451, 457, 458, 460, 461 ... 469 develop a second V-I converter. Through the second V-I converter, the current sources $I_{321}$ $I_{329}$ are generated in accordance with the feedback signal $V_B$.

A positive input terminal of the operational amplifier 450 is coupled to receive the feedback signal $V_B$. A negative input terminal of the operational amplifier 450 is coupled to a source of the transistor 451. A gate of the transistor 451 is coupled to an output terminal of the operational amplifier 450. The resistor 452 is coupled between the negative input terminal of the operational amplifier 450 and the ground. Gates of the transistor 457 and the transistor 458 are coupled each other, and they all are coupled to drains of the transistor 457 and the transistor 451. Sources of the transistor 457 and the transistor 458 are coupled to the supply voltage $V_{CC}$. Gates of the transistors 460, 461 ... 469 are coupled together, and they all are coupled to drains of the transistors 460 and 458. Sources of the transistors 460, 461 ... 469 are coupled to the ground. The current sources $I_{321} \ldots I_{329}$ are generated at drains of the transistors 461 ... 469, respectively.

Figure 8:
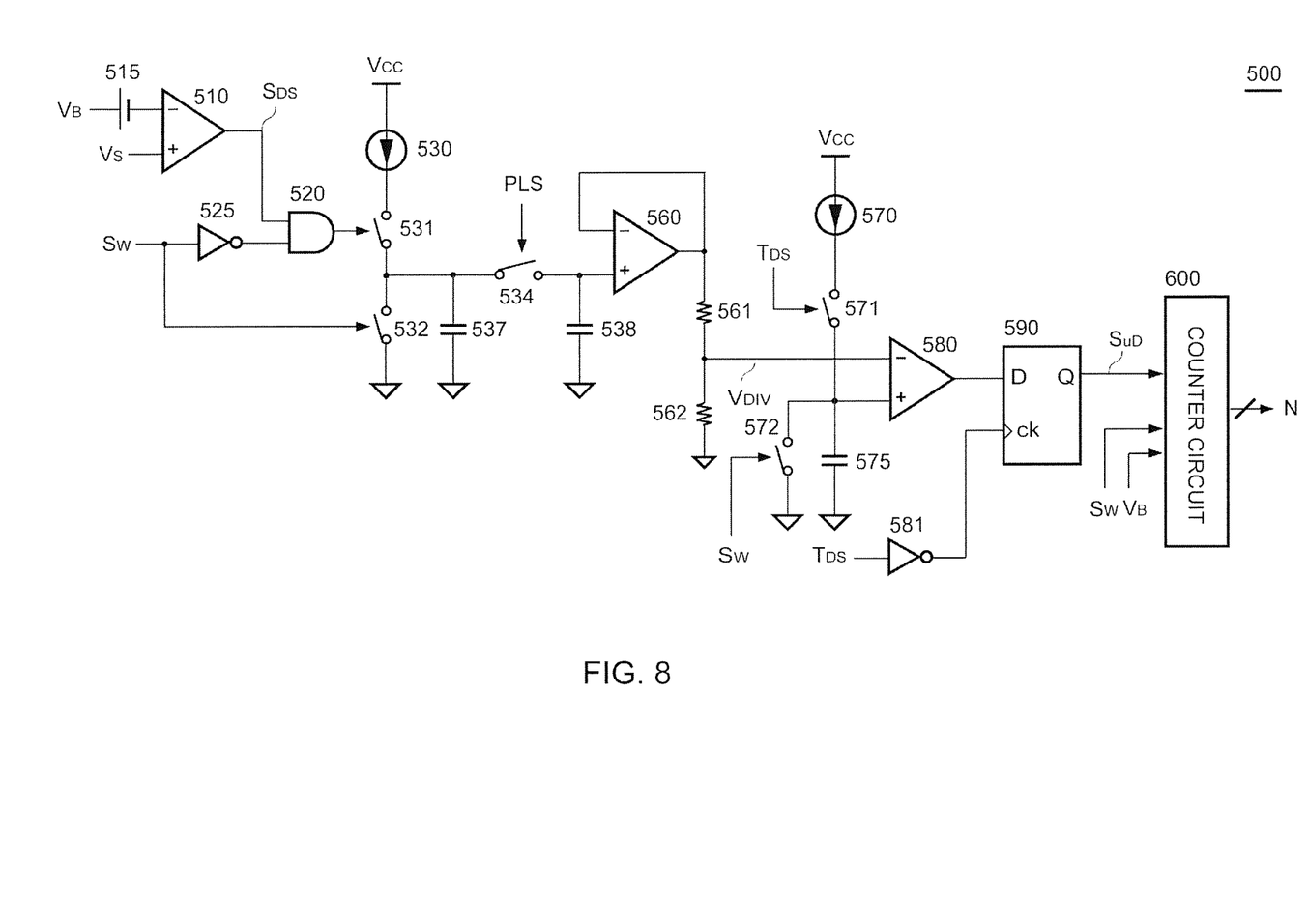
FIG. 8 is a circuit diagram of an embodiment of the adaptive circuit in accordance with the present invention.

FIG. 8 is a circuit diagram of an embodiment of the adaptive circuit 500 in accordance with the present invention. The adaptive circuit 500 is used for generating the code N. A capacitor 537 is utilized to convert the demagnetized time of the transformer 10 of the previous switching cycle of the switching signal $S_W$ to a voltage level. The pulse signal PLS will transfer the voltage of the capacitor 537 into a capacitor 538 via a switch 534 coupled between the capacitor 537 and the capacitor 538. The voltage level of the capacitor 538 is thus proportional to the demagnetized period of the previous switching cycle of the switching signal $S_W$.

A buffer amplifier 560 and resistors 561, 562 develop a voltage divider for generating a divided-voltage $V_{DIV}$ in accordance with the voltage of the capacitor 538. Thus, the divided-voltage $V_{DIV}$ represents a percentage of the demagnetized period of the previous switching cycle. The divided-voltage $V_{DIV}$ is further coupled to a negative input terminal of a comparator 580. A positive input terminal of the buffer amplifier 560 is coupled to a first terminal of the capacitor 538. A second terminal of the capacitor 538 is coupled to the ground. A negative input terminal of the buffer amplifier 560 is coupled to a first terminal of the resistor 561 and an output terminal of the buffer amplifier 560. The resistor 562 is coupled between a second terminal of the resistor 561 and the ground.

A current source 530 is coupled to the supply voltage $V_{CC}$ to charge the capacitor 537 via a switch 531. The switch 531 is coupled between the current source 530 and the capacitor 537. The capacitor 537 is discharged through a switch 532. The switch 532 is coupled between the capacitor 537 and the ground. The switch 532 is turned on by the switching signal $S_W$. A negative input terminal of a comparator 510 is coupled to the feedback signal $V_B$ though an offset voltage 515. A positive input terminal of the comparator 510 is coupled to receive the signal $V_S$ for generating a discharge signal $S_{DS}$. The enable period of the discharge signal $S_{DS}$ represents the demagnetized time of the transformer 10 (as shown in FIG. 1). When the switching signal $S_W$ is off state, the discharge signal $S_{DS}$ is coupled to enable the switch 531 via an AND gate 520.

A first input terminal of the AND gate 520 is coupled to an output terminal of the comparator 510 to receive the discharge signal $S_{DS}$. An input terminal of an inverter 525 is coupled to receive the switching signal $S_W$. An output terminal of the inverter 525 is coupled to a second input terminal of the AND gate 520. An output of the AND gate 520 controls the switch 531.

A capacitor 575 is utilized to convert the demagnetized time of the present switching cycle of the switching signal $S_W$ to a voltage level. A current source 570 is coupled to the supply voltage $V_{CC}$ to charge the capacitor 575 via a switch 571. The switch 571 is coupled between the current source 570 and the capacitor 575. The current source 570 is correlated to the current source 530. The capacitor 575 is correlated to the capacitor 537. The capacitor 575 is discharged through a switch 572. The switch 572 is coupled between the capacitor 575 and the ground. The switch 572 is turned on by the switching signal $S_W$. The on/off of the switch 571 is controlled by the demagnetized time signal $T_{DS}$. The capacitor 575 is coupled to a positive input terminal of the comparator 580 to compare with the divided-voltage $V_{DIV}$. An output terminal of the comparator 580 is coupled to an input terminal D of a flip-flop 590.

The output of the comparator 580 is latched into the flip-flop 590 for generating an up/down signal $S_{uD}$ at an output terminal Q of the flip-flop 590. The demagnetized time signal $T_{DS}$ is coupled to a clock input terminal ck of the flip-flop 590 through an inverter 581 to enable the flip-flop 590. Therefore, the flip-flop 590 is synchronized by the demagnetized time signal $T_{DS}$. The up/down signal $S_{uD}$ is further coupled to a counter circuit 600 to generate the code N. The code N is generated in response to the up/down signal $S_{DS}$, and the up/down signal $S_{uD}$ is generated in response to the demagnetized period of the transformer 10 of the previous switching cycle. In other words, the code N is generated by the adaptive circuit 500 in accordance with the demagnetized period of the previous switching cycle. The up/down signal $S_{uD}$ is used for locking the sampling time of the sample signal $S_{MP}$ (as shown in FIG. 5) to the demagnetized time of the transformer 10 of the previous switching cycle.

Therefore, the up/down signal $S_{uD}$ will be a logic-high signal for up-counting the code N and decreasing the period of the demagnetized time signal $T_{DS}$ (the sample time for sampling the demagnetized voltage of the transformer 10) when the period of the present demagnetized time signal $T_{DS}$ is longer than the percentage of the demagnetized period of the previous switching cycle (the voltage of the capacitor 575 is higher than the divided-voltage $V_{DIV}$). Also, it means that the up/down signal $S_{uD}$ will become a logic-low signal for down-counting the code N and increasing the period of the demagnetized time signal $T_{DS}$ when the period of the present demagnetized time signal $T_{DS}$ is shorter than the percentage of the demagnetized period of the previous switching cycle (the voltage of the capacitor 575 is smaller than the divided-voltage $V_{DIV}$). After the step-by-step tracking (locking) period, the code N will be fixed as a constant value that is related to the turn ratio of the transformer 10 (shown in the equation (9)).

Figure 9:
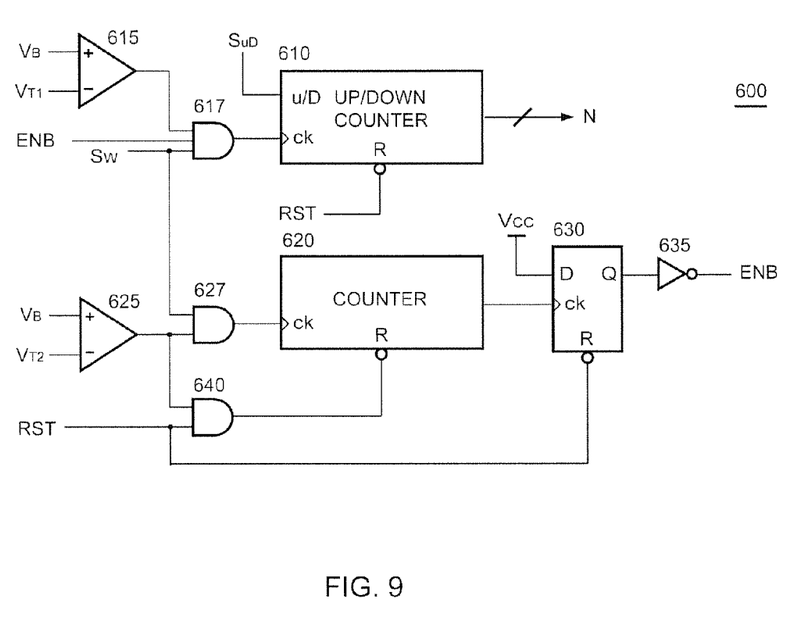
FIG. 9 is a circuit diagram of an embodiment of the counter circuit in accordance with the present invention.

FIG. 9 is circuit diagram of an embodiment of the counter circuit 600 in accordance with the present invention. An up/down counter 610 and a counter 620 have clock input terminals ck coupled to the switching signal $S_W$ via AND gates 617 and 627, respectively. The feedback signal $V_B$ is coupled to a positive input terminal of a comparator 625, and a threshold $V_{T2}$ is supplied with a negative input terminal of the comparator 625. An output terminal of the comparator 625 will enable the AND gate 627 for clocking the counter

620 when the feedback signal $V_B$ is higher than the threshold $V_{T2}$. The output terminal of the comparator 625 is further coupled to an input terminal of an AND gate 640 for resetting the counter 620 when the feedback signal $V_B$ is lower than the threshold $V_{T2}$. A power-on reset signal RST is coupled to the other input terminal of the AND gate 640 for resetting the counter 620.

The supply voltage $V_{CC}$ is coupled to an input terminal D of a flip-flop 630. An output terminal Q of the flip-flop 630 generates a signal ENB through an inverter 635. The signal ENB is coupled to the input terminal of the AND gate 617. Once the counter 620 is expired, it will generate an overflow signal coupled to a clock input terminal ck of the flip-flop 630 to latch the flip-flop 630 and disable the signal ENB. Reset input terminals R of the flip-flop 630, counter 620 and the up/down counter 610 are coupled to the power-on reset signal RST. Therefore, the signal ENB is enabled when the power of the switching control circuit 100 (as shown in FIG. 1) is turned on.

The feedback signal $V_B$ is coupled to a positive input terminal of a comparator 615, and a threshold $V_{T1}$ is supplied with a negative input terminal of the comparator 615. When the signal ENB is enabled, an output terminal of the comparator 615 will enable the AND gate 617 for clocking the up/down counter 610 if the feedback signal $V_B$ is higher than the threshold $V_{T1}$. The level of the threshold $V_{T2}$ is higher than the level of the threshold $V_{T1}$. The up/down signal $S_{uD}$ is coupled to an input terminal u/D of the up/down counter 610 to determine the up count or the down count of the up/down counter 610 and generate the code N in response to the switching signal $S_W$. The up/down counter 610 will stop the count and fix the value of the code N when the counter 620 is expired and the signal ENB is disabled.

Although the present invention and the advantages thereof have been described in detail, it should be understood that various changes, substitutions, and alternations can be made therein without departing from the spirit and scope of the invention as defined by the appended claims. That is, the discussion included in this invention is intended to serve as a basic description. It should be understood that the specific discussion may not explicitly describe all embodiments possible; many alternatives are implicit. The generic nature of the invention may not fully explained and may not explicitly show that how each feature or element can actually be representative of a broader function or of a great variety of alternative or equivalent elements. Again, these are implicitly included in this disclosure. Neither the description nor the terminology is intended to limit the scope of the claims.

What is claimed is:

1. An adaptive sampling circuit of the power converter, comprising:
    a sample-and-hold unit coupled to a transformer to generate a feedback signal by sampling a demagnetized voltage of the transformer in response to a sample signal; and
    a signal-generation circuit generating the sample signal in response to a magnetized voltage of the transformer, the demagnetized voltage of the transformer, a switching signal and a code;
    wherein the sample signal is used for sampling the demagnetized voltage; the feedback signal is correlated to an output voltage of the power converter; the switching signal is generated in response to the feedback signal for switching the transformer and regulating the output of the power converter, the code is generated in accordance with the switching signal.

2. The circuit as claimed in claim 1, wherein the code is generated by an adaptive circuit in accordance with a period of a previous switching cycle of the switching signal, the period of the previous switching cycle is correlated to a previous demagnetized period of the transformer.

3. The circuit as claimed in claim 1, wherein the demagnetized voltage is sampled before the transformer is fully demagnetized.

4. The circuit as claimed in claim 1, wherein the code will become a fixed value after a tracking period.

5. The circuit as claimed in claim 1, wherein the sample signal has a minimum pulse width in response to an off state of the switching signal.

6. The circuit as claimed in claim 1, wherein the sample-and-hold unit comprises:
    a first capacitor;
    a second capacitor generating the feedback signal;
    a first switch coupled between the transformer and the first capacitor for sampling the demagnetized voltage of the transformer to the first capacitor in response to the sample signal; and
    a second switch coupled between the first capacitor and the second capacitor to sample a voltage of the first capacitor to the second capacitor in response to a pulse signal for generating the feedback signal.

7. The circuit as claimed in claim 1, wherein the code is generated by a counter.

8. The circuit as claimed in claim 1, wherein the signal-generation circuit comprises:
    an up/down counter up-counting or down-counting for generating the code in response to a period of a present switching cycle of the switching signal and a period of a previous switching cycle of the switching signal, the period of the present switching cycle is correlated to a present demagnetized period of the transformer, the period of the previous switching cycle is correlated to a previous demagnetized period of the transformer.

9. A control circuit, comprising:
    a PWM circuit coupled to generate a switching signal to control switching of a power switch to regulate an output of a power converter; and
    a counter circuit generating a code in response to a period of a switching cycle of the switching signal, the period of the switching cycle is correlated to the demagnetized period of a transformer of the power converter.

10. The circuit as claimed in claim 9, wherein the counter circuit is coupled to up-count the code for sampling a demagnetized voltage of the transformer of the power converter when a period of a present switching cycle is longer than a period of a previous switching cycle, the period of the present switching cycle is correlated to a present demagnetized period of the transformer, the period of the previous switching cycle is correlated to a previous demagnetized period of the transformer.

11. The circuit as claimed in claim 9, wherein the counter circuit is coupled to down-count the code for sampling a demagnetized voltage of the transformer of the power converter when a period of a present switching cycle is shorter than a period of a previous switching cycle, the period of the present switching cycle is correlated to a present demagnetized period of the transformer, the period of the previous switching cycle is correlated to a previous demagnetized period of the transformer.

12. The circuit as claimed in claim 9, wherein the code related to a turn ratio of the transformer of the power converter will be generated after a tracking period.

\* \* \* \* \*